US012622188B2

(12) United States Patent
Laukkanen et al.

(10) Patent No.: US 12,622,188 B2
(45) Date of Patent: May 5, 2026

(54) SEMICONDUCTOR STRUCTURE AND METHOD

(71) Applicant: Turun Yliopisto, Turun yliopisto (FI)

(72) Inventors: Pekka Laukkanen, Turku (FI);
Juha-Pekka Lehtiö, Turku (FI); Zahra Jahanshah Rad, Turku (FI); Mikhail Kuzmin, St. Petersburg (RU); Marko Punkkinen, Turku (FI); Antti Lahti, Turku (FI); Kalevi Kokko, Turku (FI)

(73) Assignee: SISUSEMI OY, Turku (FI)

( * ) Notice: Subject to any disclaimer, the term of this patent is extended or adjusted under 35 U.S.C. 154(b) by 616 days.

(21) Appl. No.: 17/606,531

(22) PCT Filed: Apr. 23, 2020

(86) PCT No.: PCT/FI2020/050265
§ 371 (c)(1),
(2) Date: Oct. 26, 2021

(87) PCT Pub. No.: WO2020/216992
PCT Pub. Date: Oct. 29, 2020

(65) Prior Publication Data
US 2022/0208546 A1      Jun. 30, 2022

(30) Foreign Application Priority Data
Apr. 26, 2019    (FI) .................................... 20195341

(51) Int. Cl.
*H01L 21/02* (2006.01)
*H10D 62/40* (2025.01)
(52) U.S. Cl.
CPC .. *H01L 21/02236* (2013.01); *H01L 21/02164* (2013.01); *H10D 62/405* (2025.01)

(58) Field of Classification Search
CPC ......... H01L 21/02236; H01L 21/02164; H01L 29/045; H01L 21/02433; H01L 21/02516;
(Continued)

(56) References Cited

U.S. PATENT DOCUMENTS 5,225,031 A    7/1993  McKee et al.
6,255,150 B1   7/2001  Wilk
(Continued)

FOREIGN PATENT DOCUMENTS

CN         1334593 A     2/2022
JP      2000216378 A     8/2000
(Continued)

OTHER PUBLICATIONS

Szekeres et al., "AFM surface imaging of thermally oxidized hydronated crystalline silicon," Applied Surface Science 191 (2002), pp. 148-152. (Year: 2002).*
(Continued)

*Primary Examiner* — Julia Slutsker
(74) *Attorney, Agent, or Firm* — Tarolli, Sundheim, Covell & Tummino LLP

(57) ABSTRACT

This disclosure relates to a semiconductor structure (100), comprising a crystalline silicon substrate (110), having a surface (111), and a crystalline silicon oxide superstructure (120) on the surface (111) of the silicon substrate (110), the silicon oxide superstructure (120) having a thickness of at least two molecular layers and a (1×1) plane structure using Wood's notation.

15 Claims, 2 Drawing Sheets

(58) Field of Classification Search
CPC ......... H01L 21/02381; H01L 21/02362; H01L 21/02488; H01L 21/02238; H10D 62/405; C30B 31/06

See application file for complete search history.

(56) References Cited

U.S. PATENT DOCUMENTS

| | | |
|---|---|---|
| 6,479,173 B1 | 11/2002 | Yu et al. |
| 6,613,677 B1 | 9/2003 | Herbots |
| 7,851,365 B1 | 12/2010 | Herbots |
| 2002/0014700 A1 | 2/2002 | Tokai |
| 2013/0298984 A1 | 11/2013 | Kherani |

FOREIGN PATENT DOCUMENTS

| | | | |
|---|---|---|---|
| JP | 2005322892 A | 11/2005 | |
| JP | 2007099618 A | 4/2007 | |
| WO | 2018234620 A1 | 12/2018 | |

OTHER PUBLICATIONS

International Search Report dated Jul. 31, 2020 for corresponding International Application No. PCT/FI2020/050265.

Finnish Search Report dated Aug. 26, 2019 for corresponding FI Application No. 20195341.

Herbots, N., et al. (2001). "The formation of ordered, ultrathin SiO2/Si(100) interfaces grown on (1×1) Si(100)" Materials Science and Engineering: B87(3), pp. 303-316. doi:10.1016/s0921-5107(01)00729-2.

Notice of Reasons for Rejection dated Mar. 5, 2024 in corresponding JP Application No. 2021-562806.

The Chinese Office Action dated Oct. 24, 2024 in the CN Application No. 202080031175.2.

The Japanese Office Action dated Nov. 19, 2024 in the JP Application No. 2021-562806.

Szekeres et al. "AFM surface imaging of thermally oxidized hydrogenated crystalline silicon" Applied Surface Science 191 (2002) pp. 148-152.

Patent Decision Document for Priority Claim No. 20195341.

* cited by examiner

100

130

120

111

110

200

Providing the silicon substrate

202 — Cleaning the deposition surface

203 — RCA cleaning
*OPTIONAL*

204 — Pre-annealing
*OPTIONAL*

*OPTIONAL*

201

Heating the silicon substrate

205

Supplying molecular oxygen

206

Depositing a dielectric capping layer
*OPTIONAL*

207

SEMICONDUCTOR STRUCTURE AND METHOD

RELATED APPLICATIONS

The present application is a U.S. National Stage application under 35 USC 371 of PCT Application Serial No. PCT/FI2020/050265, filed on 23 Apr. 2020; which claims priority to FI patent application No. 20195341, filed on 26 Apr. 2019, the entirety of each which are incorporated herein by reference.

FIELD OF TECHNOLOGY

This disclosure concerns semiconductor structures and methods for forming thereof. In particular, this disclosure concerns silicon oxide structures for surface passivation of silicon-based semiconductor devices.

BACKGROUND

Silicon is the most common substrate material in conventional semiconductor devices, such as transistors, capacitors, diodes, photodiodes, and other types of microelectronic and photonic components. In all such devices, interface quality of a substrate is of utmost importance.

In conventional devices, surfaces of silicon substrates are typically passivated by growing a layer of thermal oxide onto said surfaces. However, known oxidation methods result in amorphous silicon oxide layers. The amorphousness of such oxide layers necessarily leads to existence of defect states at passivated silicon surfaces. This inevitably deteriorates performance of devices fabricated onto conventionally passivated substrates. Moreover, conventional oxidation procedures rely on relatively high processing temperatures, which may deteriorate properties of silicon substrates and/or structures fabricated onto such substrates. In light of such challenges, it may be desirable to develop new solutions related to passivation of silicon surfaces.

In US 20060003500 A1, a method is disclosed where one atomic layer of oxygen is deposited self-limitedly on an existing silicon surface to form one molecular layer of crystalline silicon dioxide.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to a first aspect, a semiconductor structure is provided. The semiconductor structure comprises a crystalline silicon substrate, having a surface, and a crystalline silicon oxide superstructure on the surface of the silicon substrate, the silicon oxide superstructure having a thickness of at least two molecular layers and a (1×1) plane structure using Wood's notation.

According to a second aspect, a method for forming a semiconductor structure, comprising a crystalline silicon substrate and a crystalline silicon oxide superstructure on the silicon substrate, is provided. The method comprises providing the silicon substrate, having a substantially clean deposition surface in a vacuum chamber; heating the silicon substrate to an oxidation temperature $T_O$ in a range from 100 to 530° C.; and, while keeping the silicon substrate at the oxidation temperature, supplying molecular oxygen ($O_2$) into the vacuum chamber with an oxidation pressure $P_O$ in a range from $1×10^{-8}$ millibars (mbar) to $1×10^{-4}$ mbar and an oxygen dose $D_O$ in a range from 0.1 to 10 000 Langmuir (L).

Through this, the crystalline silicon oxide superstructure is formed on the deposition surface, the silicon oxide superstructure having a thickness of at least two molecular layers and a (1×1) plane structure using Wood's notation.

According to a third aspect, the present disclosure relates to use of a crystalline silicon oxide superstructure, having a (1×1) plane structure using Wood's notation, in a semiconductor structure for passivation of a surface of a crystalline silicon substrate.

In an embodiment of the third aspect, the semiconductor structure is a semiconductor structure in accordance with the first aspect or any embodiment of the first aspect. It is specifically to be understood that a crystalline silicon oxide superstructure may be used according to the third aspect for passivation of a surface of a crystalline silicon substrate in a semiconductor structure according to the first aspect or any embodiment of the first aspect.

BRIEF DESCRIPTION OF THE DRAWINGS

The present disclosure will be better understood from the following Detailed Description read in light of the accompanying drawings, wherein.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

Moreover, corresponding elements in the embodiments of any two drawings of the aforementioned drawings may be disproportionate to each other in said two drawings in order to emphasize certain structural aspects of the embodiments of said two drawings.

DETAILED DESCRIPTION

Figures 1, 2:
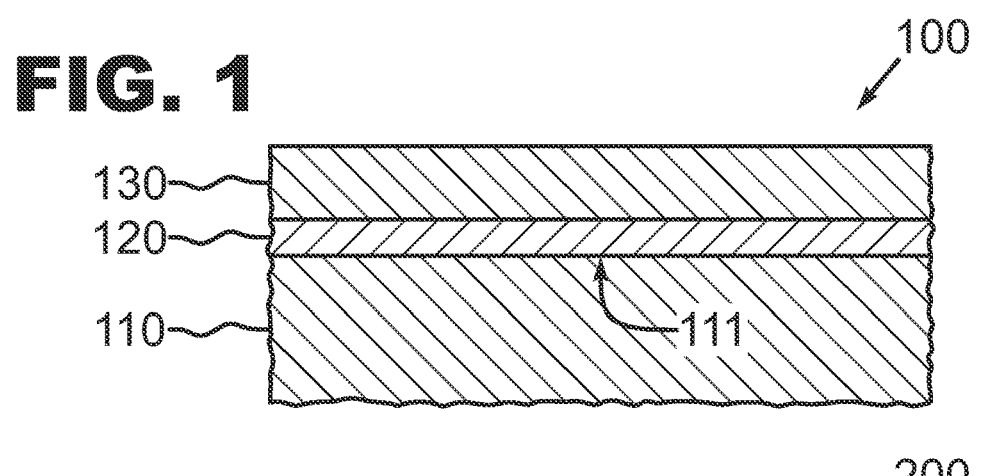
FIG. 1 shows a cross-sectional view of a semiconductor structure.
FIG. 2 illustrates a method for forming a semiconductor structure.

FIG. 1 schematically depicts a partial cross-sectional view of a semiconductor structure 100 according to an embodiment.

In this specification, a "semiconductor" may refer to a material, such as silicon (Si), possessing a conductivity intermediate between the conductivity of conductive materials, such as metals, and the conductivity of insulating materials, such as many plastics and glasses. A semiconductor, e.g., Si, may or may not have a crystalline structure.

Herein, "crystalline" structure of a material may refer to constituents, such as atomic nuclei, of said material forming an ordered, three-dimensional crystal lattice.

Further, a "semiconductor structure" may refer to a structure which may comprise all or only part of structural parts, layers, and/or other elements of a complete, operable semiconductor component, element, or device, such as a transistor, e.g., a power transistor or a phototransistor; a capacitor; a diode, e.g., a photodiode or a power diode; a microprocessor; or a photonic device, e.g., a display, photodetector, or a solar cell. In the case of forming only a part of such component, element, or device, the term "structure" may be considered as a structure "for", or a building block of, such component, element, or device. In particular, a semiconductor structure may generally comprise non-semiconducting materials, such as conductors and/or insulators, in addition to semiconductor materials.

In the embodiment of FIG. 1, the semiconductor structure 100 comprises a crystalline silicon substrate 110.

Throughout this disclosure, a "substrate" may refer to a solid body providing a surface, which may be flat or slightly curved, such that material may be arranged, deposited, etched, and/or inscribed on the surface. For example, a substrate may comprise a wafer, comprising a semiconductor material, such as Si, suitable for manufacturing various semiconductor structures and/or devices, e.g., integrated circuits, solar cells, or photodetectors.

Herein, a "surface" may refer to a finite part of a generalization of a plane, which may have a non-zero, possibly position-dependent curvature and which may preferably be smooth. Further, a surface may be connected, i.e., non-divisible into two disjoint sub-surfaces, or path-connected. Some surfaces may be simply connected. Additionally or alternatively, a surface may refer to a part of an outer boundary of a body or an element. A surface may specifically refer to a part of an outer boundary of a body or an element viewable from a particular viewing direction, or a part thereof.

The silicon substrate 110 of the embodiment of FIG. 1 has a surface 111. In other embodiments, a silicon substrate may generally comprise a surface.

The surface 111 of the embodiment of FIG. 1 is a crystalline surface. In other embodiments, a silicon substrate may have an at least partly, i.e., partly or entirely, crystalline surface.

Throughout this specification, a "crystalline surface" may refer to a surface of a piece of crystalline material with such translational symmetry that a two-dimensional lattice and/or a two-dimensional unit cell may be defined therefor. Additionally or alternatively, a crystalline surface may refer to a surface of a crystalline body, which may or may not extend (substantially) along a crystallographic plane of a bulk lattice of said crystalline body.

Although the surface 111 of the silicon substrate 110 is depicted in FIG. 1 as a single line segment, a surface of a silicon substrate may generally comprise any number of any type of features typical of crystalline surfaces, such as adatoms, step adatoms, kink atoms, step atoms, and/or surface vacancies.

In the embodiment of FIG. 1, the semiconductor structure 100 also comprises a crystalline silicon oxide superstructure 120 on the surface 111 of the silicon substrate 110.

In this disclosure, a "superstructure" may refer to any structure, for example, a layer, that is arranged on a crystalline structure, part, or element. Further, a "layer" may refer to a generally sheet-shaped element arranged on a surface or a body. Additionally or alternatively, a layer may refer to one of a series of super-imposed, overlaid, or stacked generally sheet-shaped elements.

Further, "silicon oxide" may refer to a binary compound comprising Si and oxygen (O). Silicon oxide may refer to stoichiometric silicon dioxide ($SiO_2$) and/or non-stoichiometric silicon oxide ($SiO_x$). Silicon oxide may or may not comprise trace amounts of elements other than Si or O as impurities.

The silicon oxide superstructure 120 of the embodiment of FIG. 1 has a thickness of at least two molecular layers. In particular, the silicon oxide superstructure 120 has a thickness of about 3 nanometers (nm). Generally, a higher thickness of a silicon oxide superstructure may reduce a density of pinholes and/or other defects in said silicon oxide superstructure, while a lower thickness may improve performance of a semiconductor device comprising said silicon oxide superstructure. In other embodiments, a silicon oxide superstructure may have any thickness of at least two molecular layers, for example, a thickness greater than or equal to 1 nm, 2 nm, or 3 nm and/or less than or equal to 10 nm, 7 nm, or 5 nm.

Throughout this specification, a "thickness" may refer to a measurement of an element measured perpendicular to a surface of a silicon substrate. Further, a thickness of "at least two molecular layers" may refer to a combined thickness of at least two units of a repeating structural motif of a crystalline polymorph of silicon dioxide, e.g., quartz (for example, α-quartz). Additionally or alternatively, a thickness of at least two molecular layers may refer to a thickness greater than or equal to about 0.5 nm, or 0.7 nm, or 1 nm.

Although the silicon oxide superstructure 120 is depicted in FIG. 1 as having a constant thickness, a silicon oxide superstructure may generally have a thickness which may be position-dependent, substantially constant, or constant.

The silicon oxide superstructure 120 of the embodiment of FIG. 1 has a (1×1) plane structure using Wood's notation. Such structure of a silicon oxide superstructure may generally improve a surface quality of a silicon substrate by reducing surface defect density. In other embodiments, a silicon oxide superstructure may generally have such structure.

As known to the skilled person, "Wood's notation" is a method for specifying a crystalline structure of an ordered superstructure, such as a layer, on a surface of a crystalline substrate in terms of surface lattice vectors derived from bulk lattice vectors of said substrate. Usage of Wood's notation may be usable if a microstructure of a superstructure has symmetry properties related to symmetry properties of a crystalline substrate.

Herein, a "(1×1) plane structure" may refer to a crystalline microstructure of a superstructure, for example, an epitaxial-like superstructure, having a crystallographic plane extending (substantially) parallel to a surface of a crystalline substrate. Said crystallographic plane may have a unit cell, for example, a primitive unit cell, with two lattice vectors with lengths presentable as (1×1) using Wood's notation. A (1×1) plane structure may specifically refer to a (1×1)R0° structure. In particular, a (1×1) silicon oxide superstructure may or may not refer to (1×1)R0°-$SiO_2$ structure.

The existence of a (1×1) silicon oxide superstructure on a surface of a crystalline silicon substrate may generally be directly and positively verified, for example, by combining three types of standard surface-characterization methods. First, a superstructure, such as a layer, to be tested must be exposed, if necessary. Then, X-ray photoelectron spectroscopy (XPS) may be used to confirm the presence of silicon oxide at the surface. Following XPS, low-energy electron diffraction (LEED) analysis may be conducted. If the LEED analysis shows a (1×1) pattern, scanning tunneling microscopy (STM) may be employed. If STM shows no features indicative of reconstruction patterns typical of clean, unoxidized silicon surfaces but, instead, patterns, such as rows, with inter-pattern distances similar to and/or substantially equal (for example, same within 25%, or 20%, or 10%) to a relevant lattice constant of the surface of the crystalline silicon substrate, a (1×1) silicon oxide superstructure exists on the surface.

In the embodiment of FIG. 1, the semiconductor structure 100 further comprises a dielectric capping layer 130 on the silicon oxide superstructure 120. Such capping layer may generally passivate a silicon oxide superstructure, prolonging its lifetime. Additionally or alternatively, such capping layer may facilitate utilizing a semiconductor structure in a semiconductor device, such as a field-effect transistor or a capacitor, wherein a dielectric layer of sufficiently high thickness and/or relative permittivity is required. In other embodiments, a semiconductor structure may or may not comprise a capping layer on a silicon oxide superstructure.

Herein, a "capping layer" may refer to a layer arranged on a silicon oxide superstructure, which may cover said silicon oxide superstructure at least partly, i.e., partly or entirely.

The capping layer 130 of the embodiment of FIG. 1 may be amorphous. In other embodiments, wherein a semiconductor structure comprises a capping layer, said capping layer may have any suitable at least partly ordered (for example, crystalline, semicrystalline, or quasicrystalline) or disordered (for example, amorphous) structure.

The capping layer 130 of the embodiment of FIG. 1 may have, for example, a thickness of about 10 nm. A higher thickness of a capping layer may increase a passivation effect conferred by said capping layer, while a lower thickness may provide other advantageous features in a semiconductor device. In other embodiments, wherein a semiconductor structure comprises a capping layer, said capping layer may have any suitable thickness, for example, a thickness greater than or equal to 1 nm, 2 nm, or 5 nm and/or less than or equal to 500 nm, 250 nm, or 100 nm.

The capping layer 130 of the embodiment of FIG. 1 may comprise a dielectric material with a relative permittivity (K) greater than or equal to 10. Examples of such materials include hafnium oxide ($HfO_2$), tantalum oxide ($Ta_2O_5$), hafnium silicate ($HfSiO_4$), titanium dioxide ($TiO_2$), strontium titanate ($SrTiO_3$), barium titanate ($BaTiO_3$), lanthanum aluminum oxide ($LaAlO_3$), zirconium dioxide ($ZrO_2$), zirconium silicate ($ZrSiO_4$), cerium oxide ($CeO_2$), yttrium oxide ($Y_2O_3$), or a mixture thereof. In other embodiments, a capping layer may comprise any suitable dielectric material(s), for example, oxide, nitrides, oxynitrides, silicates, and/or titanates, which may or may not have a relative permittivity greater than or equal to 10, greater than or equal to 20, or greater than or equal to 50.

It is to be understood that any of the preceding embodiments of the first aspect may be used in combination with each other. In other words, several of the embodiments may be combined together to form a further embodiment of the first aspect.

Above, mainly structural and material aspects of semiconductor structures are discussed. In the following, more emphasis will lie on aspects related to methods for forming semiconductor structures. What is said above about the ways of implementation, definitions, details, and advantages related to the structural and material aspects apply, mutatis mutandis, to the method aspects discussed below. The same applies vice versa.

It is specifically to be understood that a method according to the second aspect may be used to provide a semiconductor structure according to the first aspect and any of the embodiments described in relation to the first aspect. Correspondingly, any semiconductor structure according to any embodiment of the first aspect may be fabricated using a method according to the second aspect.

FIG. 2 depicts a method 200 for forming a semiconductor structure, comprising a crystalline silicon substrate and a crystalline silicon oxide superstructure on the silicon substrate, according to an embodiment.

In the embodiment of FIG. 2, the method 200 comprises, in process 201, providing the silicon substrate, having a substantially clean deposition surface in a vacuum chamber. In other embodiments, a method for forming a semiconductor structure, comprising a crystalline silicon substrate and a crystalline silicon oxide superstructure on the silicon substrate, may generally comprise providing the silicon substrate.

In this specification, a "process" may refer to a series of one or more steps, leading to an end result.

As such, a process may be a single-step or a multistep process. Additionally, a process may be divisible to a plurality of sub-processes, wherein individual sub-processes of such plurality of sub-processes may or may not share common steps. Herein, a "step" may refer to a measure taken in order to achieve a predefined end result.

Throughout this disclosure, "providing" may refer to arranging available the element or part at issue. It may comprise forming, producing, or manufacturing the element or part at issue at least partly. Additionally or alternatively, providing may comprise arranging available an element or part which is ready-made or produced or manufactured beforehand. For example, a process of providing the silicon substrate may or may not comprise one or more steps taken in order to form a substantially clean deposition surface of said silicon substrate.

Throughout this specification, a "deposition surface" may refer to a surface of a silicon substrate on which additional material may be introduced and/or adsorbed. With regard to crystal orientation, a deposition surface may be, for example, a silicon {100}, a silicon {111}, or a silicon {110} surface. In some embodiments, a deposition surface may be a relaxed and/or a reconstructed surface, such as a Si(100) (2×1) or a Si(111)(7×7) surface. In some embodiments, a deposition surface may be an adsorbate-terminated surface, such as a hydrogen-terminated surface, e.g., Si(100)(1×1)-H.

Additionally, a deposition surface being "substantially clean" may refer, for example, to said deposition surface being substantially free of any native silicon oxide or impurity atoms of any other type. Herein, being "substantially free" may refer to a concentration of foreign atoms and molecules on a silicon surface not exceeding $3 \times 10^{13}$ cm$^{-2}$. Such substantially clean deposition surface may be provided as cleaned beforehand, i.e., before a method for forming a semiconductor structure. Alternatively, cleaning of a deposition surface may be included in such method. Such cleaning may be carried out by any appropriate cleaning process (es).

In the process of providing the silicon substrate 201 of the embodiment of FIG. 2, the deposition surface may be a silicon {100} surface. In other embodiments, a deposition surface may be, for example, a silicon {100}, a silicon {111}, or a silicon {110} surface.

In the embodiment of FIG. 2, the process of providing the silicon substrate 201 comprises the optional process of cleaning the deposition surface 202 for removing possible native oxide and/or other impurities therefrom before the process of supplying molecular oxygen. In other embodiments, a process of providing the silicon substrate may or may not comprise such process of cleaning the deposition surface. In some embodiments, a deposition surface of a crystalline silicon substrate may be, for example, cleaned in advance by another party.

The process of cleaning the deposition surface 202 of the embodiment of FIG. 2 comprises an RCA cleaning step 203. Such RCA cleaning step may generally facilitate a process of cleaning the deposition surface and/or enable cleaning a deposition surface at lower temperatures. In other embodiments, a process of cleaning the deposition surface may or may not comprise an RCA cleaning step.

Herein, an "RCA cleaning step" may refer to a cleaning step, wherein a deposition surface is exposed to an aqueous SC-1 solution, comprising water ($H_2O$), hydrogen peroxide ($H_2O_2$), and ammonium hydroxide ($NH_4OH$), and/or an aqueous SC-2 solution, comprising H2O, H2O2, and hydrochloric acid (HCl). In an RCA cleaning step, silicon oxides may or may not be stripped from a deposition surface after SC-1 immersion and/or SC-2 immersion by immersing said deposition surface in aqueous hydrofluoric acid (HF) solution and/or by exposing said deposition surface to HF vapor. Such HF treatments may generally enable high-throughput removal of silicon oxide impurities at lower processing temperatures.

The process of cleaning the deposition surface 202 of the embodiment of FIG. 2 further comprises, following the RCA cleaning step 203, a pre-annealing step 204. In the pre-annealing step 204, the crystalline silicon substrate is annealed at a pre-annealing temperature ($T_A$) in a range from 200 to 300° C. and a pre-annealing pressure ($P_A$) less than or equal to $1 \times 10^{-4}$ mbar for a pre-annealing period with a pre-annealing duration ($t_A$) greater than or equal to 1 min. Such pre-annealing step may reduce a density of defects on a deposition surface of a silicon substrate. In particular, such reduction in defect density may be achieved with a $T_A$ sufficiently low for use with metallized samples. In other embodiments, a process of cleaning the deposition surface may or may not comprise such pre-annealing step. In embodiments, wherein a process of cleaning the deposition surface comprises such pre-annealing step, a crystalline silicon substrate may or may not be annealed under a hydrogen ($H_2$) or an $O_2$ atmosphere. In some embodiments, a process of cleaning the deposition surface may comprise a pre-annealing step with $T_A$, $P_A$, and/or $t_A$ different to the $T_A$, $P_A$, and $t_A$ of the pre-annealing step 204 of the embodiment of FIG. 2. In said embodiments, $T_A$ in a range from 210 to 290° C., or 220 to 280° C., or 230 to 270° C.; $P_A$ less than or equal to $1 \times 10^{-5}$ mbar, or $1 \times 10^{-6}$ mbar, or $1 \times 10^{-7}$ mbar; and/or $t_A$ greater than or equal to 5 min, or 10 min, or 30 min may be used, for example. In some embodiments, a process of cleaning the deposition surface may comprise HF immersion and/or HF vapor treatment(s) after a pre-annealing step.

In the embodiment of FIG. 2, the method 200 comprises, in process 205, heating the silicon substrate to an oxidation temperature $T_O$ in a range from 100 to 530° C. Such $T_O$ may enable forming a crystalline silicon oxide superstructure on a crystalline silicon substrate. In particular, such $T_O$ may result in sufficiently low diffusivity of silicon and/or oxygen nuclei to inhibit the formation of a buried oxide layer within said silicon substrate. In other embodiments, a method for forming a semiconductor structure, comprising a crystalline silicon substrate and a crystalline silicon oxide superstructure on the silicon substrate, may generally comprise such process. In said other embodiments, a $T_O$ in a range from 100 to 530° C., or 150 to 520° C., or 200 to 500° C., or 250 to 480° C., or 300 to 460° C., or 350 to 450° C. may be utilized.

In the embodiment of FIG. 2, the method 200 comprises, in process 206, supplying molecular oxygen ($O_2$) into the vacuum chamber with an oxidation pressure ($P_O$) in a range from $1 \times 10^{-8}$ millibars (mbar) to $1 \times 10^{-4}$ mbar and an oxygen dose $D_O$ in a range from 0.1 to 10 000 Langmuir (L), while keeping the silicon substrate at $T_O$. By such means, a crystalline silicon oxide superstructure is formed on the deposition surface, the silicon oxide superstructure having a (1×1) plane structure using Wood's notation. In other embodiments, a method for forming a semiconductor structure, comprising a crystalline silicon substrate and a crystalline silicon oxide superstructure on the silicon substrate, may generally comprise such process. In said other embodiments, a $P_O$ in a range from $1 \times 10^{-8}$ mbar to $1 \times 10^{-5}$ mbar, or from $1 \times 10^{-7}$ mbar to $1 \times 10^{-6}$ mbar, or from $5 \times 10^{-7}$ mbar to $5 \times 10^{-5}$ mbar may be utilized. In said other embodiments, a $D_O$ in a range from 1 to 1000 L, or from 5 to 500 L, or in a range from 10 to 100 L may be used.

In the process of supplying molecular oxygen 206 of the embodiment of FIG. 2, $O_2$ may be supplied into the vacuum chamber for an oxidation period with an oxidation duration ($t_O$) in a range from 0.5 seconds (s) to 30 minutes (min). In other embodiments, $O_2$ may supplied into the vacuum chamber during oxidation period(s) with any suitable duration(s). In some embodiments, for example, a $t_O$ in a range from 0.5 s, to 30 min, or from 30 s to 15 min, or from 1 min to 10 min may be utilized.

In the embodiment of FIG. 2, the method 200 further comprises the optional process of depositing a dielectric capping layer 207 on the silicon oxide superstructure. Such deposition of a capping layer may be achieved at least partly, for example, by atomic layer deposition (ALD), chemical vapor deposition (CVD), sputtering, and/or evaporation.

Notably, the method 200 of the embodiment of FIG. 2 serves as one particular example of a method for forming a semiconductor structure, comprising a crystalline silicon substrate and a crystalline silicon oxide superstructure on the silicon substrate, with a maximum processing temperature $T_{max}$ less than or equal to 500° C. Generally, a lower $T_{max}$ enables usage of such method in situations requiring stricter thermal budgets. In particular, a lower $T_{max}$ may inhibit formation of silicon carbide (SiC), which may in turn reduce a density of grain boundaries and/or dislocations at the deposition surface after processing. Additionally or alternatively, certain structures, such as metallization structures, fabricated onto a substrate may necessitate usage of lower processing temperatures. In other embodiments, a method for forming a semiconductor structure, comprising a crystalline silicon substrate and a crystalline silicon oxide superstructure on the silicon substrate, may have any suitable $T_{max}$, for example, a $T_{max}$ less than or equal to 1200° C., or less than or equal to 500° C., or less than or equal to 480° C., or less than or equal to 460° C., or less than or equal to 450° C.

In an embodiment, a method for forming a semiconductor structure, comprising a crystalline silicon substrate and a crystalline silicon oxide superstructure on the silicon substrate, comprises processes corresponding to the processes 201, 205, 206 of the method 200 of the embodiment of FIG. 2.

Generally in a method for forming a semiconductor structure, comprising a crystalline silicon substrate and a crystalline silicon oxide superstructure on the silicon substrate, steps implementing processes corresponding to any of the processes 201, 202, 205, 206, 207 of the method 200 of the embodiment of FIG. 2 need not be executed in a fixed order. Additionally, a method for forming a semiconductor structure, comprising a crystalline silicon substrate and a crystalline silicon oxide superstructure on the silicon substrate, may comprise any number of additional processes or steps that are not disclosed herein in connection to the method 200 of the embodiment of FIG. 2.

In the following, a number of examples are discussed.

In a first example, a 6 millimeter (mm)×12 mm rectangular Si sample was cut from an n-type Si(100) wafer to serve as a crystalline silicon substrate with a Si(100) deposition surface. The Si sample was attached via its shorter edges on a sample holder made of molybdenum (Mo), allowing direct current feeding through the Si sample. The sample holder was transferred into a manipulator located in a vacuum chamber of a multichamber vacuum system, and the Si sample was repeatedly rapidly heated up to a cleaning temperature in a range from 1100 to 1200° C. to remove any native oxide and carbon contaminants from the Si(100) deposition surface. LEED analysis showed a sharp (2×1)+ (1×2) reconstruction arising from an inherent double-domain surface structure. STM images captured after the surface cleaning supported the presence of the double-domain reconstruction on large two-dimensional terraces.

After the cleaning phase, the Si sample with the clean Si(100) deposition surface was oxidized in the same vacuum system, using $O_2$ gas introduced into the vacuum chamber via a leak valve. Before opening the leak valve, the temperature of the Si sample was increased to an oxidation temperature ($T_O$) of about 450° C. Then, the oxidation pressure ($P_O$) in the vacuum chamber was increased to $1×10^{-6}$ mbar, as measured by an ion gauge pressure meter, and the Si sample was oxidized at $T_O$ for 200 s, resulting in an oxidation dose of 200 L. Thereafter, the leak valve was closed, and the Si heating was stopped simultaneously.

Following the oxidation of the Si sample, XPS was used to confirm that the deposition surface of the Si sample comprised silicon oxide. Additionally, LEED analysis of the Si sample showed a simple (1×1) pattern. Typically, such results would be indicative of formation of an amorphous silicon oxide layer on top of Si(100), such that the (1×1) LEED diffraction spots would arise from bulk Si(100) planes beneath such amorphous layer.

Figure 3:
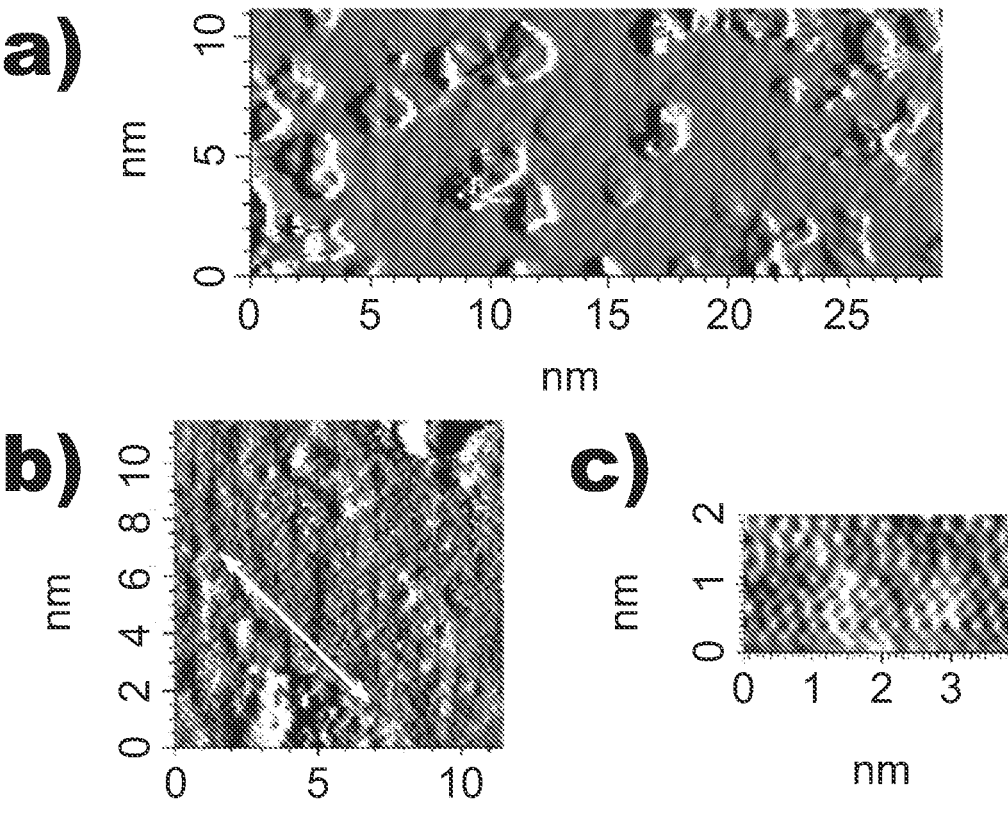
FIGS. 3a, 3b, and 3c depict scanning tunneling microscopy images of a silicon sample.

However, as depicted in FIG. 3a, STM images captured after the oxidation revealed the existence of smooth islands on the Si sample. No Si-dimer row structure was detected on the top of the smooth islands, consistently with the preceding XPS and LEED results. Instead, as depicted in FIGS. 3b and 3c, high-resolution STM images of the smooth islands revealed a row structure, having an inter-row distance of about 0.39 nm, which is close to Si(100) lattice constant. In FIG. 3b, the rows extend on the surface of the oxidized Si sample substantially along a direction indicated by a white double-headed arrow.

Overall, the results indicate the formation of an epitaxial-like crystalline silicon oxide superstructure on the deposition surface of the Si sample, the silicon oxide superstructure obeying the lattice structure of Si substrate. The crystalline structure of the silicon oxide superstructure follows Si(100) (1×1) plane periodicity. As such, the silicon oxide superstructure has a (1×1) plane structure using Wood's notation.

Additionally, the (1×1) LEED pattern of the Si sample was more intensive than a typical pattern of a Si(100) surface covered by an amorphous silicon oxide layer, in particular at especially surface-sensitive electron binding energies around 100 electron-volts (eV). Such high-intensity LEED pattern was consistent with the STM images, indicating the formation of an epitaxial-like crystalline silicon oxide superstructure.

In a second example, an n-type float-zone (FZ) Si wafer and a p-type FZ Si wafer, with resistivities of 3 ohm-metres (Ωm) and diameters of 102 mm (4 inches), served as crystalline silicon substrates with a Si(100) deposition surfaces. The deposition surfaces of the Si wafers were cleaned in a standard RCA cleaning step, comprising both an RCA-1 and an RCA-2 part, followed by a pre-annealing step at a $T_A$ of 1050° C. in an oxygen atmosphere. The pre-annealing step resulted in the growth of an amorphous silicon oxide layer, which was etched using a buffered aqueous hydrofluoric acid (HF) solution prior to introducing the wafer into a vacuum chamber of an industrial ultra-high vacuum (UHV) system. To complete the process of cleaning the deposition surface, the Si wafers were subjected to a pre-annealing step at a $T_A$ of 200° C. until outgassing stopped.

After the cleaning process, oxidation of the wafers was performed by introducing $O_2$ gas into the vacuum chamber via a leak valve, using oxidation process parameters similar to the oxidation parameters of the first example. This resulted in the formation of crystalline silicon oxide superstructures on the deposition surfaces of the wafers. Following the oxidation, the wafers were cooled down and transferred into an ALD instrument, which was used to grow, using trimethylaluminium (TMA) and water as precursors, capping layers of $Al_2O_3$ with thicknesses of about 20 nm onto the silicon oxide superstructures.

Finally, a corona oxide characterization of semiconductor (COCOS) technique was employed to assess defect density at interfaces between the crystalline Si wafers and the crystalline silicon oxide superstructures thereon. Based on the results of such COCOS measurements, the interfaces exhibited decreased interface defect densities. The results were consistent with separate carrier lifetime measurements, which showed increased minority carrier lifetimes for the substrates with the crystalline silicon oxide superstructures thereon.

In a third example, a 6 mm×12 mm Si sample was cut from a vicinal, i.e., off-cut, Si(111) wafer to serve as a crystalline silicon substrate. Cleaning and oxidation of the Si sample was conducted using procedures and process parameters similar to the first example with the exception that a lower $T_O$ of about 400° C. was utilized for the oxidation.

Figure 4:
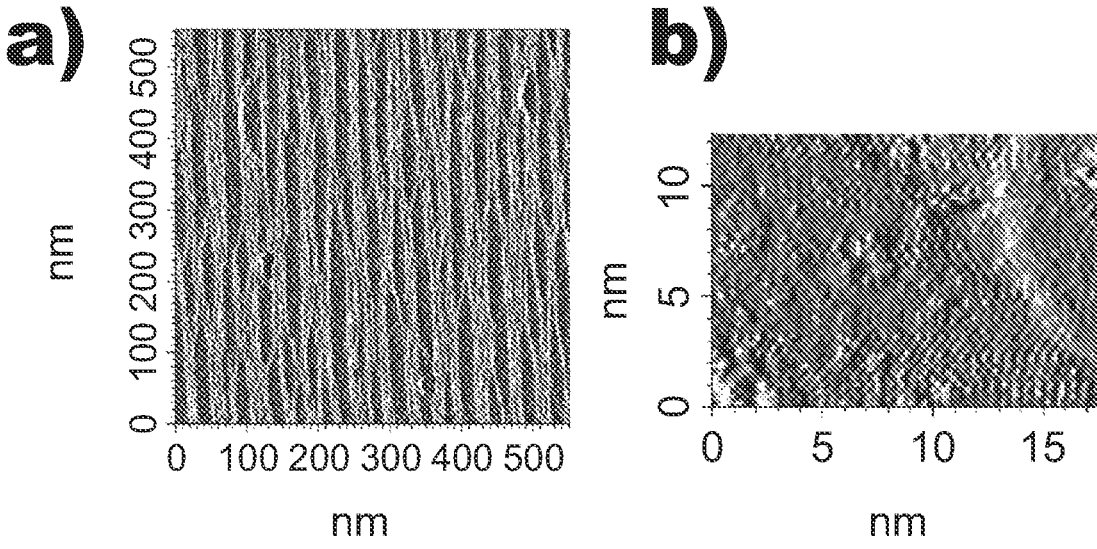
FIGS. 4a and 4b show scanning tunneling microscopy images of another silicon sample.

Scanning tunneling spectroscopy (STS) of the vicinally cut Si(111) surface revealed a surface band gap of about 5 eV after oxidation, indicating formation of a silicon oxide superstructure on the surface. Additionally, as depicted in FIGS. 4a and 4b, STM images captured after the oxidation revealed the existence of row structures that obey the hexagonal lattice structure of the Si substrate.

Overall, results of the STS and STM measurements indicate the formation of a crystalline silicon oxide superstructure on the vicinal Si(111) surface of the Si sample. Based on the results, the crystalline structure of the silicon oxide superstructure follows Si(111)(1×1) plane periodicity.

It is obvious to a person skilled in the art that with the advancement of technology, the basic idea of the invention may be implemented in various ways. The invention and its embodiments are thus not limited to the examples described above, instead they may vary within the scope of the claims.

It will be understood that any benefits and advantages described above may relate to one embodiment or may relate to several embodiments. The embodiments are not limited to those that solve any or all of the stated problems or those that have any or all of the stated benefits and advantages.

The term "comprising" is used in this specification to mean including the feature(s) or act(s) followed thereafter, without excluding the presence of one or more additional features or acts. It will further be understood that reference to 'an' item refers to one or more of those items.

REFERENCE SIGNS

100 semiconductor structure
110 silicon substrate
111 surface
120 silicon oxide superstructure
130 capping layer
200 method
201 providing the silicon substrate
202 cleaning the deposition surface
203 RCA cleaning step
204 pre-annealing step
205 heating the silicon substrate
206 supplying molecular oxygen
207 depositing a dielectric capping layer

The invention claimed is:

1. A semiconductor structure, comprising a crystalline silicon substrate, having a surface, and a superstructure on the surface of the silicon substrate, wherein the superstructure comprises silicon oxide that is crystalline, the superstructure having a thickness of at least two molecular layers and a (1×1) plane structure using Wood's notation, wherein the superstructure is formed on the surface as crystalline silicon oxide with no trace amounts of elements other than Si or O as impurities by:

providing the silicon substrate, having a substantially clean deposition surface in a vacuum chamber;

heating the silicon substrate to an oxidation temperature $T_O$ in a range from 100 to 530° C.; and while keeping the silicon substrate at the oxidation temperature, supplying molecular oxygen, $O_2$, into the vacuum chamber with an oxidation pressure $P_O$ in a range from $1×10^{-8}$ millibars, mbar, to $1×10^{-4}$ mbar and an oxygen dose $D_O$ in a range from 0.1 to 10 000 Langmuir, L.

2. A semiconductor structure according to claim 1, wherein the surface is a silicon {100}, a silicon {111}, or a silicon {110} surface.

3. A semiconductor structure according to claim 1, wherein the superstructure has a thickness greater than or equal to 1 nanometers, nm, and/or less than or equal to 10 nm.

4. A semiconductor structure according to claim 1, further comprising a dielectric capping layer on the superstructure.

5. A semiconductor structure according to claim 4, wherein the capping layer comprises a dielectric material with a relative permittivity, κ, greater than or equal to 10.

6. A method for forming a semiconductor structure, comprising a crystalline silicon substrate and a crystalline silicon oxide superstructure on the silicon substrate, the method comprising:

providing the silicon substrate, having a substantially clean deposition surface in a vacuum chamber;

heating the silicon substrate to an oxidation temperature $T_O$ in a range from 100 to 530° C.; and while keeping the silicon substrate at the oxidation temperature, supplying molecular oxygen, $O_2$, into the vacuum chamber with an oxidation pressure $P_O$ in a range from $1×10^{-8}$ millibars, mbar, to $1×10^{-4}$ mbar and an oxygen dose $D_O$ in a range from 0.1 to 10 000 Langmuir, L;

whereby the crystalline silicon oxide superstructure, made of silicon oxide that is crystalized with no trace amounts of elements other than Si or O as impurities, is formed on the deposition surface, the superstructure having a thickness of at least two molecular layers and a (1×1) plane structure using Wood's notation.

7. A method according to claim 6, wherein the deposition surface is a silicon {100}, a silicon {111}, or a silicon {110} surface.

8. A method according to claim 6, wherein the oxidation temperature $T_O$ lies in a range from 150 to 520° C.

9. A method according to claim 6, wherein the oxidation pressure $P_O$ lies in a range from $1×10^{-8}$ mbar to $1×10^{-5}$ mbar.

10. A method according to claim 6, wherein the oxygen dose $D_O$ lies in a range from 1 to 1000 L.

11. A method according to claim 6, wherein the molecular oxygen $O_2$ is supplied into the vacuum chamber for an oxidation period with an oxidation duration, $t_O$, in a range from 0.5 seconds, s, to 30 minutes, min.

12. A method according to claim 6, wherein the process of providing the silicon substrate comprises cleaning the deposition surface for removing possible native oxide and/or other impurities therefrom before the process of supplying molecular oxygen.

13. A method according to claim 12, wherein the process of cleaning the deposition surface comprises an RCA cleaning step and, following the RCA cleaning step, a pre-annealing step at a pre-annealing temperature, $T_A$, in a range from 200 to 300° C. and a pre-annealing pressure, $P_A$, less than or equal to $1×10^{-4}$ mbar for a pre-annealing period with a pre-annealing duration, $t_A$, greater than or equal to 1 min.

14. A method according to claim 6, further comprising depositing a dielectric capping layer on the silicon oxide superstructure.

15. A method according to claim 6, having a maximum processing temperature $T_{max}$ less than or equal to 500° C.

* * * * *